(12) United States Patent
Van Ausdall et al.

(10) Patent No.: US 9,979,389 B2
(45) Date of Patent: May 22, 2018

(54) CAPACITIVE BODY PROXIMITY SENSOR SYSTEM

(75) Inventors: Terrence Lee Van Ausdall, Boulder Creek, CA (US); Mathieu Hoffmann, San Diego, CA (US); Pascal Monney, San Diego, CA (US)

(73) Assignee: SEMTECH CORPORATION, Camarillo, CA (US)

( * ) Notice: Subject to any disclaimer, the term of this patent is extended or adjusted under 35 U.S.C. 154(b) by 563 days.

(21) Appl. No.: 13/549,017

(22) Filed: Jul. 13, 2012

(65) Prior Publication Data

US 2014/0015595 A1 Jan. 16, 2014

(51) Int. Cl.
*H03K 17/955* (2006.01)
*H04B 1/3827* (2015.01)

(52) U.S. Cl.
CPC ......... *H03K 17/955* (2013.01); *H04B 1/3838* (2013.01); *H03K 2217/96073* (2013.01); *H03K 2217/960705* (2013.01); *H03K 2217/960745* (2013.01); *H04M 2250/12* (2013.01)

(58) Field of Classification Search
CPC .. G01R 27/26; G01R 27/2605; H03K 17/955; H03K 17/962; H03K 17/9622; H03K 2017/9602; H03K 2217/960705; H03K 2217/960755; G01D 5/24
See application file for complete search history.

(56) References Cited

U.S. PATENT DOCUMENTS

| 8,077,032 | B1 | 12/2011 | Vier et al. | |
|---|---|---|---|---|
| 2003/0071727 | A1* | 4/2003 | Haag | H03K 17/955 340/562 |
| 2003/0210203 | A1 | 11/2003 | Phillips et al. | |
| 2006/0250142 | A1 | 11/2006 | Abe | |
| 2008/0109956 | A1 | 5/2008 | Bayley et al. | |
| 2008/0111714 | A1 | 5/2008 | Kremin | |
| 2009/0266701 | A1* | 10/2009 | Gremm | H03K 17/962 200/600 |
| 2010/0259283 | A1* | 10/2010 | Togura | H03K 17/955 324/679 |

(Continued)

FOREIGN PATENT DOCUMENTS

| DE | 102007048402 A1 | 4/2009 |
|---|---|---|
| EP | 2187241 A1 | 5/2010 |

(Continued)

OTHER PUBLICATIONS

International Search Report for PCT Patent Application No. US 13/48961 dated Nov. 22, 2013, 14 pages.

(Continued)

*Primary Examiner* — Son Le
*Assistant Examiner* — Dustin Dickinson
(74) *Attorney, Agent, or Firm* — Amin, Turocy & Watson, LLP

(57) ABSTRACT

Described herein are systems, methods and apparatuses that can detect the proximity of an object and differentiate between a human body and a non-human object. The detection and differentiation are facilitated by a first capacitive sensor of a first shape and a second capacitive sensor of a second shape. The detection and determination can be made based on a comparison between a first capacitance from the first sensor and a second capacitance from the second sensor.

18 Claims, 3 Drawing Sheets

(56) References Cited

U.S. PATENT DOCUMENTS

| | | |
|---|---|---|
| 2010/0317302 A1 | 12/2010 | Greenwood et al. |
| 2011/0012793 A1 | 1/2011 | Amm et al. |
| 2011/0012794 A1 | 1/2011 | Schlub et al. |
| 2011/0115652 A1* | 5/2011 | Werner ................ G06F 1/3231 341/24 |
| 2011/0139517 A1* | 6/2011 | Mizushima ......... G06F 3/03547 178/18.06 |
| 2011/0215814 A1* | 9/2011 | Dorrough .............. G01R 27/26 324/663 |
| 2011/0291986 A1* | 12/2011 | Rebeschi et al. ............. 345/174 |
| 2012/0098783 A1* | 4/2012 | Badaye ................... G06F 3/044 345/174 |
| 2012/0112767 A1 | 5/2012 | Nonogaki |
| 2012/0146668 A1* | 6/2012 | Satake ................... B60N 2/002 324/662 |
| 2012/0214422 A1* | 8/2012 | Shi et al. ................... 455/67.11 |
| 2013/0063155 A1* | 3/2013 | Tarui ...................... G01R 35/00 324/601 |
| 2013/0098941 A1* | 4/2013 | Wegelin ............. B05B 11/0037 222/23 |

FOREIGN PATENT DOCUMENTS

| | | |
|---|---|---|
| EP | 2276109 A1 | 1/2011 |
| EP | 2360561 A1 | 8/2011 |
| WO | 2009149023 A1 | 12/2009 |

OTHER PUBLICATIONS

European Search Report dated Feb. 25, 2016 for European Patent Application No. 13817134.3, 12 pages.

\* cited by examiner

CAPACITIVE BODY PROXIMITY SENSOR SYSTEM

TECHNICAL FIELD

This disclosure generally relates generally to a body proximity sensor, and more specifically to a body proximity sensor that employs capacitive sensors of different sizes and/or configurations to facilitate the determination of whether an object in proximity to an electronic device is a human body or a non-human object.

BACKGROUND

Many electronic devices include components that emit radio-frequency (RF) electromagnetic field (EMF) emissions. Examples of such electronic devices include mobile communication devices, tablet computing devices, laptop computing devices, and the like. Human exposure to these RF EMF emissions is harmful if the radiation power is high, at close range, and/or over a prolonged time.

SUMMARY

The following presents a simplified summary to provide a basic understanding of some aspects of the subject disclosure. This summary is not an extensive overview of the disclosed subject matter. It is not intended to identify key or critical elements of the disclosed subject matter, nor is it intended to delineate the scope of the subject disclosure or the claims. Its sole purpose is to present some concepts of the disclosed subject matter in a simplified form as a prelude to the more detailed description presented later.

In a non-limiting embodiment of the subject disclosure, a system is described that can be used as a body proximity sensor. The system includes a first sensor and a second sensor. The first sensor has a first shape and detects a first capacitance related to an object. The second sensor has a second shape different from the first shape and detects a second capacitance related to the object. The system also includes an electronic component that processes the first capacitance and the second capacitance to facilitate discrimination of whether the object is a human body or a non-human object.

In another non-limiting embodiment, a method is described. The method can be used to determine whether an object is a human body or a non-human object. The method includes processing a first capacitance from a first sensor with a first shape and a second capacitance from a second sensor with a second shape different from the first sensor. The method also includes determining a type of object in proximity of the first sensor and the second sensor based on the first capacitance and the second capacitance.

In a further non-limiting embodiment, an apparatus is described. The apparatus can be used as a body proximity sensor. The apparatus includes a first sensor and a second sensor. The first sensor has a first shape and detects a first capacitance. The second sensor has a second shape different from the first shape and detects a second capacitance. The apparatus also includes an electronic component that processes the first capacitance and the second capacitance to facilitate determination of whether the object is a human body or a non-human object.

The following description and the annexed drawings set forth in detail certain illustrative aspects of the disclosed subject matter. These aspects are indicative, however, of a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

In the following description, numerous specific details are set forth to provide a thorough understanding of the embodiments of the subject disclosure. One skilled in the relevant art will recognize, however, that the embodiments described herein can be practiced without one or more of the specific details, or with other methods, components, materials, etc. In other instances, well-known structures, materials, or operations are not shown or described in detail to avoid obscuring certain aspects.

According to an aspect of the subject disclosure, described herein are systems, apparatuses and methods that can facilitate detection of an object within the proximity of an electronic device and differentiate between a human body and a non-human object. The detection and differentiation are facilitated by a first capacitive sensor of a first shape and a second capacitive sensor of a second shape. The detection and determination can be made based on a comparison between a first capacitance from the first sensor and a second capacitance from the second sensor. Upon detection of a human body, RF EMF emissions of the electronic device can be reduced.

Figure 1:
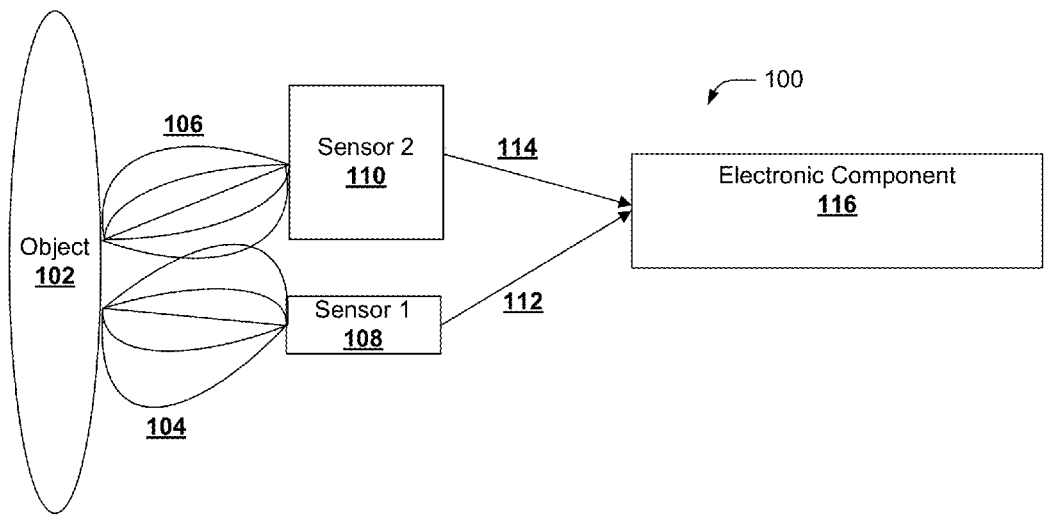
FIG. 1 is a schematic illustration of an example body detection system, according to an embodiment of the subject disclosure.

A schematic illustration of an example body detection system 100, according to an embodiment of the subject disclosure, is shown in FIG. 1. The body detection system 100 can, for example, be miniaturized and included in an electronic device or apparatus, such as a mobile communications device, a tablet computing device, a laptop computing device, or other portable electronic device, to facilitate reduction in RF EMF emissions when a human body is in proximity to the electronic device. The system 100 can be included in the electronic device at a low cost.

The body detection system 100 includes a first sensor (sensor 1) 108 and a second sensor (sensor 2) 110. It will be understood that the system 100 can include any number of sensors greater than or equal to 2. Two sensors 108, 110 are shown merely for simplicity of illustration and description.

The sensors 108, 110 are located near to each other, as shown, for example, in FIGS. 2-5. The sensors 108, 110 are of different shapes (in other words, the first sensor 108 has a first shape and the second sensor 110 has a second shape). When used herein, the word "shape" generally refers to area, perimeter, circumference, or the like. Examples of different sensor designs are shown in FIGS. 2-5. It will also be understood that "shape" can refer to "configuration."

Figure 2:
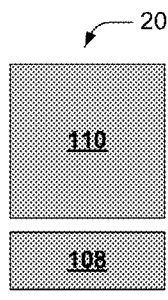
FIG. 2 is a schematic illustration of an example sensor design for a body detection system, according to an embodiment of the subject disclosure.
Figure 3:
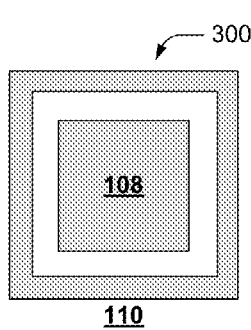
FIGS. 3 and 4 are schematic illustrations of example two-dimensionally symmetrical sensor designs for a body detection system, according to an embodiment of the subject disclosure.
Figure 4:
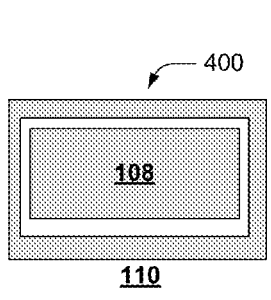
Figure 5:
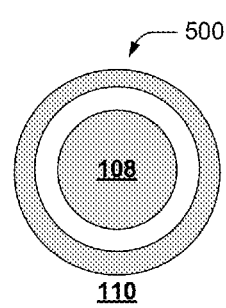
FIG. 5 is a schematic illustration of an example fully symmetrical sensor design for a body detection system, according to an embodiment of the subject disclosure.

FIG. 2 shows a design 200 where sensors 108, 110 are located near to each other, where the two sensors 108, 110 have different shapes (e.g., area, perimeter, circumference, etc.). FIGS. 3 and 4 show designs 300, 400 where the sensors 108, 110 are additionally two-dimensionally symmetrical sensors. FIG. 5 shows a design 500 where the sensors are additionally fully-symmetrical. The use of designs 300, 400, 500 can improve object 102 type discrimination (e.g., human body or inanimate object) compared to design 200. For example, use of a fully-symmetrical sensor pair 108, 110 as shown in FIG. 5 can reduce directionality issues.

In an embodiment, the first sensor 108 and the second sensor 110 are capacitive sensors. The first sensor 108 detects a first capacitance 104 related to an object 102 and the second sensor 110 detects a second capacitance 106 related to the object 102 when the object 102 is in proximity of the sensors 108, 110. The object 102 can be either a human body or an inanimate object.

In an embodiment, the first sensor 108 has a first area and the second sensor 110 has a second area the same as or different from the first area. In another embodiment, the first sensor 108 has a first perimeter and the second sensor 110 has a second perimeter different from the first perimeter. In a further embodiment, the first sensor 108 has a first circumference and the second sensor 110 has a second circumference different from the first circumference. In a further embodiment, the first sensor 108 has a first configuration and the second sensor 110 has a second configuration different from the first configuration, but the sensors 108, 110 have the same area.

Figure 6:
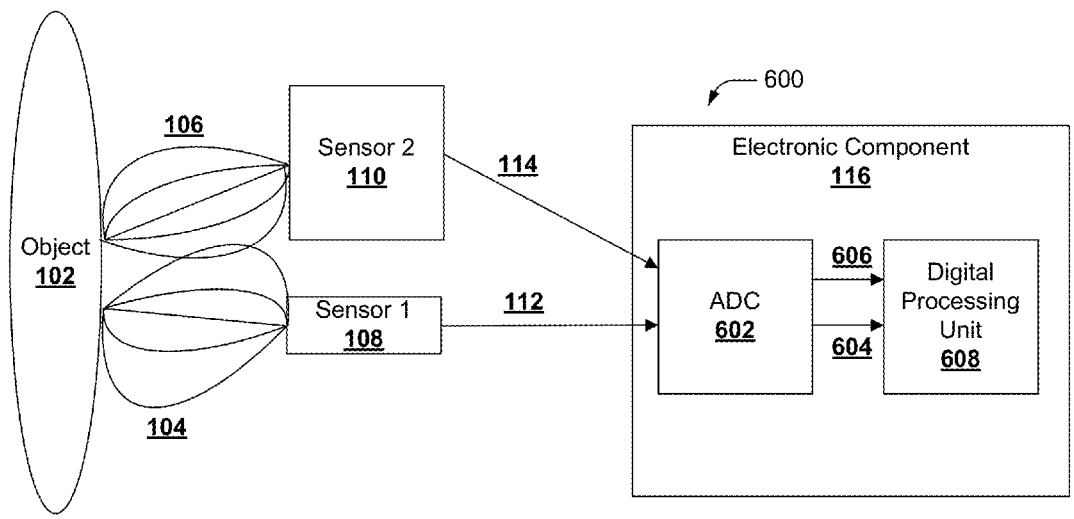
FIG. 6 is a schematic illustration of an example capacitive human body/inanimate object discrimination system, according to an embodiment of the subject disclosure.

As shown in FIG. 6, the electronic component 116 of system 600 can include an analog-to-digital converter (ADC) 602 and a digital processing unit 608. The front end (e.g., sensors 108, 110) senses capacitances 104, 106 and sends analog signals 112, 114 of the capacitances to the electronic component. The ADC 602 of the electronic component 116 converts the analog signals 112, 114 to digital signals 604, 606 for further processing by the digital processing unit 606. The ADC 602, in an embodiment, is a single time-multiplexed capacitance-to-digital converter, which can also measure capacitance values (C1 and C2).

The first sensor 108 and the second sensor 110 can send signals 112, 114 to an electronic component 116 in response to detection of capacitances 104, 106 caused by object 102. The electronic component 116, according to an embodiment, can include a memory and a processor to facilitate processing the first capacitance (or capacitive signal 112 from first sensor 108) and the second capacitance (or capacitive signal 114 from second sensor 110) to facilitate discrimination of whether the object 102 in proximity of the sensors 108, 110 is a human body or a non-human object based on the first capacitance and the second capacitance.

In an embodiment, the electronic component 116 uses values of the first capacitance and the second capacitance to facilitate the discrimination. In another embodiment, the electronic component 116 uses a difference between the first capacitance and the second capacitance to facilitate the discrimination. In a further embodiment, the electronic component 116 uses a ratio of the first capacitance and the second capacitance to facilitate the discrimination.

The electronic component 116, in another embodiment, can employ a proximity detection algorithm (stored in the memory and executed by the processor) that utilizes the first capacitance, the second capacitance, the difference between the first capacitance and the second capacitance, and the ratio between the first capacitance and the second capacitance to sense proximity of the object 102 and/or to facilitate determination of whether the object 102 is a human body or an inanimate object.

According to the proximity detection algorithm, the total equivalent capacitance between an approaching object 102 and the two sensors 108, 110 is the sum of parallel plate (area) and fringe (perimeter or circumference) capacitances. When an object 102 approaches the sensors 108, 110, the EMF lines between the object and each sensor (the total capacitances 104, 106) will vary differently over time. The capacitance profiles over time also depend on the size and dielectric nature of the material of the object 102 approaching. It is, therefore, possible to discriminate between objects with different properties, such as a human body and an inanimate object, such as: a table, a seat, a bag, or the like.

The proximity detection algorithm processes signals 112 and 114 that contain capacitance information profiles over time using the absolute values (C1 and C2) as well as their difference (C2−C1) and ratio (C2/C1), which vary differently depending of the type of object 102 that the sensors 108, 112 are facing. This allows for detection of body proximity (or discrimination of the object 102 between a human body and an inanimate object).

As shown in FIG. 6, the electronic component 116 of system 600 can include an analog-to-digital converter (ADC) 602 and a digital processing unit 606. The front end (e.g., sensors 108, 110) senses capacitances 104, 106 and sends analog signals 112, 114 of the capacitances to the electronic component. The ADC 602 of the electronic component 116 converts the analog signals 112, 114 to digital signals 604, 606 for further processing by the digital processing unit 606. The ADC 602, in an embodiment, is a single time-multiplexed capacitance-to-digital converter, which can also measure capacitance values (C1 and C2).

The electronic component 116 can also include a shield, such as an active bias driver, that tracks the voltage on the sensors 108, 110. The active shield technique increases immunity to noise and parasitic capacitances and can increase the accuracy of the system 600 in detecting body proximity. It may also provide sensing directionality.

Figure 7:
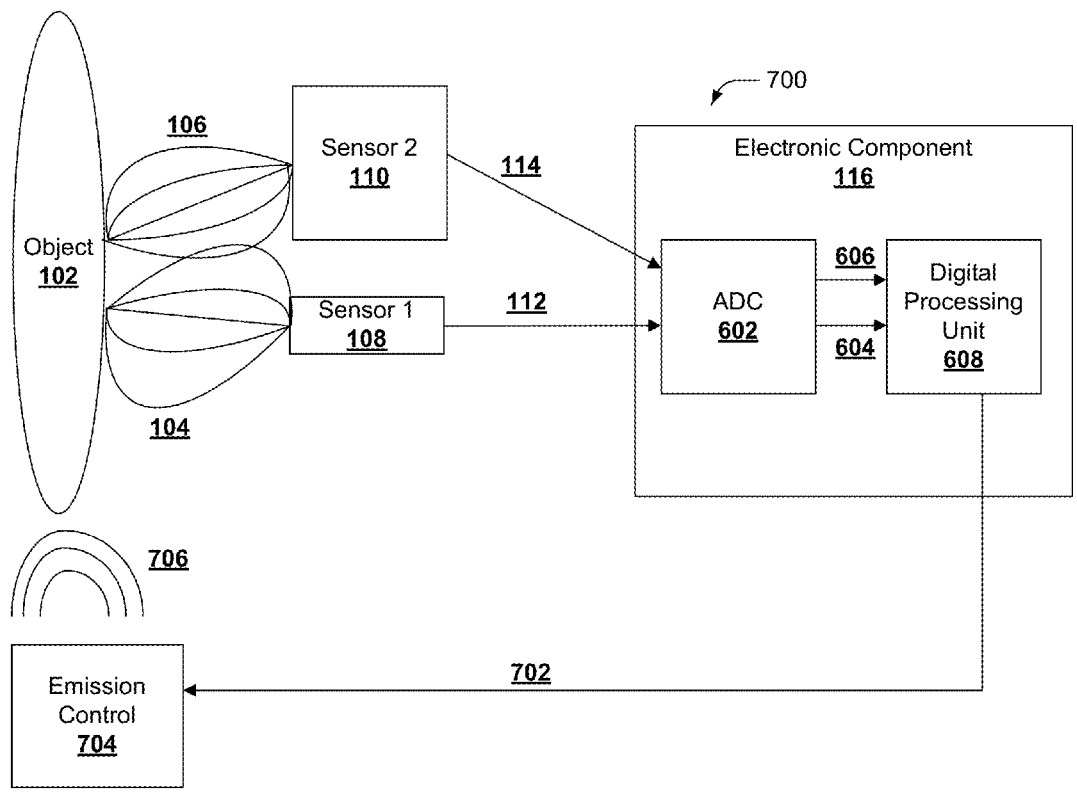
FIG. 7 is a schematic illustration of a system that reduces emissions when a human body is detected, according to an embodiment of the subject disclosure.

Referring now to FIG. 7, illustrated is a system 700 that reduces emissions when a human body is detected, according to an embodiment of the subject disclosure. For example, system 700 can be implemented within a portable electronic device, such as a mobile communications device, a tablet computing device, a laptop computing device, or the like.

Generally, in electronic devices, RF EMF emissions (EMF radiation power control in electronic RF devices), if varied, is adapted for optimal wireless communication, but not for the presence of human bodies (or other live beings) near its source. System 700 provides a way to detect proximity of a person to an EMF radiation source, which can provide safer usage conditions for the electronic device by reducing RF EMF emissions (EMF power) in the presence of a human body, while providing optimal RF transmissions (e.g., wireless transmissions).

System 700, in an embodiment, is a low-cost and miniaturized electronic body detection system that can discriminate between a human body and an inanimate object. If a human body is detected in proximity, system 700 can facilitate reduction in RF EMF emissions. System 700 can provide significant advantages for manufacturers of electronic devices with RF EMF radiation sources to meet stringent criteria for emission regulations and specific absorption rate (SAR) standards.

System 700 utilizes sensors 108, 110 of different sizes and electronic component 116 to facilitate the detection of a human body in proximity (detecting that an object 102 is a human body rather than an inanimate object). In an embodiment, the electronic component 116 can employ a proximity detection algorithm that can process signals 604 and 606 from ADC 602 that contain capacitance values C1 and C2. The proximity detection algorithm can also utilize the difference (C2−C1) and a ratio (C2/C1), which vary differently depending of the type of object 102 that the sensors 108, 112 are facing to facilitate discrimination of the object 102 between a human body and an inanimate object.

When a human body is detected in proximity to the electronic device, the sensors 108, 110, and/or the radiation source, the electronic component 116 can send a signal 702 (e.g., a feedback signal) to an emission control device 704 of the electronic device. In response to the signal 702, the emission control device 704 can limit RF EMF emissions 706 (in other words limit RF output power). Therefore, RF EMF radiation exposure is limited for the detected human body in proximity to the electronic device. In other words, when a human body is discriminated as in proximity to the electronic device, the electromagnetic radiation power or the exposure time from a radiation source can be limited.

Figure 8:
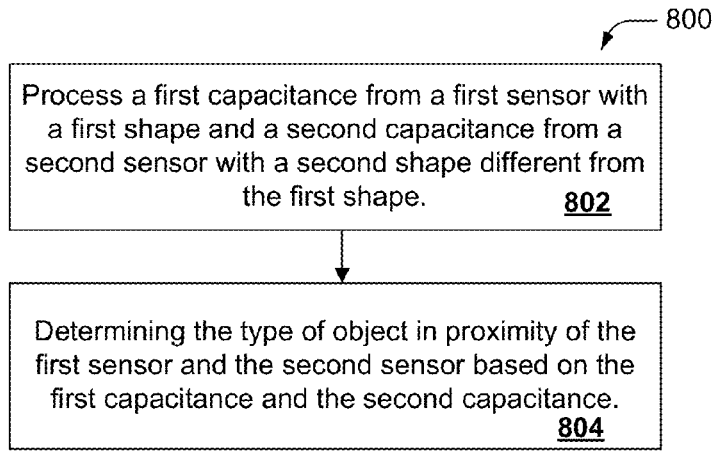
FIG. 8 is a process flow diagram illustrating a method for discriminating between a human body and an inanimate object, according to an embodiment of the subject disclosure.
Figure 9:
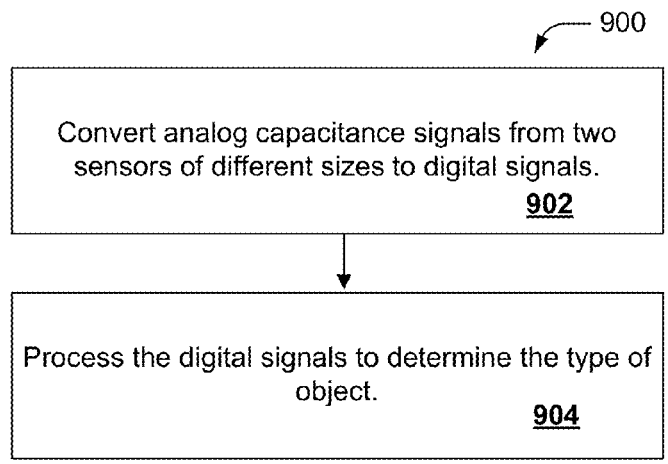
FIG. 9 is a process flow diagram illustrating a method for discriminating between a human body and an inanimate object based on digital signals, according to an embodiment of the subject disclosure.
Figure 10:
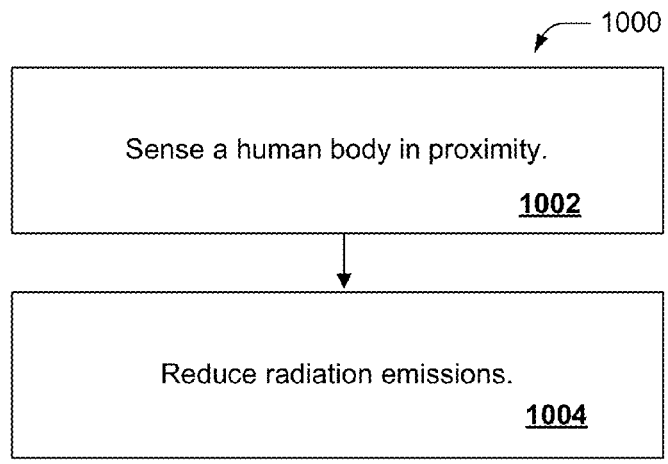
FIG. 10 is a process flow diagram illustrating a method for reducing radiation emissions if a human body is in proximity, according to an embodiment of the subject disclosure.

FIGS. 8-10 show methods illustrated as flow diagrams. For simplicity of explanation, the methods are depicted and described as series of acts. However, the methods are not limited by the acts illustrated and by the order of acts. For example, acts can occur in various orders and/or concurrently, and with other acts not presented and described herein. Furthermore, not all illustrated acts may be required to implement the methods. Additionally, it should be further appreciated that the methods can be implemented on an article of manufacture (e.g., within a portable electronic device) to facilitate transporting and transferring the methods.

Referring now to FIG. 8, illustrated is a process flow diagram of a method 800 for discriminating between a human body and an inanimate object, according to an embodiment of the subject disclosure. At element 802, a first capacitance from a first sensor with a first shape (area, perimeter, circumference, or the like) and a second capacitance from a second sensor with a second shape different shape are processed. The first sensor and the second sensor can be capacitive sensors. In an embodiment, the first sensor and the second sensor can be made of a conductive material.

The first sensor and the second sensor have different shapes (e.g., one or more of different areas, different perimeters, or different circumferences) or configurations. The first sensor and the second sensor can be located near to each other (FIG. 2), in a two-dimensionally symmetrical arrangement (FIGS. 3 and 4), or in a fully-symmetrical arrangement (FIG. 5).

The first capacitance and the second capacitance are caused by an object in proximity to the first sensor and the second sensor. At element 804, a type of object in proximity of the first sensor and the second sensor can be determined (e.g., by electronic component 116) based on the first capacitance and the second capacitance. Additionally, the determination can also utilize a difference between the first capacitance and the second capacitance and/or a ratio between the first capacitance and the second capacitance.

The determination can be accomplished according to a proximity detection algorithm (stored in the memory and executed by the processor) that utilizes the first capacitance, the second capacitance, the difference between the first capacitance and the second capacitance, and the ratio between the first capacitance and the second capacitance to sense proximity of the object and/or to facilitate determination of whether the object is a human body or an inanimate object.

According to the proximity detection algorithm, the total equivalent capacitance between an approaching object and the two sensors is the sum of parallel plate (area) and fringe (perimeter or circumference) capacitances. When an object approaches the sensors, the EMF lines between the object and each sensor will vary differently over time. The capacitance profiles over time also depend on the size and dielectric nature of the material of the object approaching. It is, therefore, possible to discriminate between objects with different properties, such as a human body and an inanimate object.

The proximity detection algorithm processes signals that contain capacitance information profiles over time using the absolute values (C1 and C2) as well as their difference (C2−C1) and ratio (C2/C1), which vary differently depending of the type of object that the sensors are facing. This allows for discrimination of the object between a human body and an inanimate object.

Referring now to FIG. 9, illustrated is a process flow diagram of a method 900 for discriminating between a human body and an inanimate object based on digital signals, according to an embodiment of the subject disclosure. To detect body proximity, two sensors are employed. The sensors are capacitive sensors of two different shapes. The sensors sense capacitances caused by an object in proximity (e.g., to an electronic device or to a radiation/emissions source). The sensors send analog signals of the capacitances for further processing.

At element 902, the analog capacitance signals from the two sensors of different sizes are converted to digital signals. In an embodiment, the conversion can be accomplished by an analog-to-digital converter. In another embodiment, the conversion can be accomplished by a time-multiplexed capacitance-to-digital converter, which can measure capacitance values (C1 and C2).

At element 904, the digital signals can be processed (e.g., by a digital signal processor) to determine the type of object (human body or inanimate object) that caused the capacitances. The digital signals can be processed according to a proximity detection algorithm (stored in the memory and executed by the processor) that utilizes the first capacitance (C1), the second capacitance (C2), the difference between the first capacitance and the second capacitance (C2–C1), and the ratio between the first capacitance and the second capacitance (C2/C1) to sense proximity of the object and/or to facilitate determination of whether the object is a human body or an inanimate object.

According to the proximity detection algorithm, the total equivalent capacitance between an approaching object and the two sensors is the sum of parallel plate (area) and fringe (perimeter or circumference) capacitances. When an object approaches the sensors, the EMF lines between the object and each sensor will vary differently over time. The capacitance profiles over time also depend on the size and dielectric nature of the material of the object approaching. It is, therefore, possible to discriminate between objects with different properties, such as a human body and an inanimate object, such as: a table, a seat, a bag, or the like.

The proximity detection algorithm processes signals that contain capacitance information profiles over time using the absolute values (C1 and C2) as well as their difference (C2–C1) and ratio (C2/C1), which vary differently depending of the type of object that the sensors are facing. This allows for discrimination of the object between a human body and an inanimate object.

Referring now to FIG. 10, illustrated is a process flow diagram of a method 1000 for reducing radiation emissions if a human body is in proximity, according to an embodiment of the subject disclosure. At element 1002, a human body is sensed in proximity to a radiation source. Sensors of different sizes sense capacitances caused by an object in proximity to the sensors. The capacitances can be used (e.g., according to a proximity detection algorithm) to determine if the object is a human body or an inanimate object.

At element 1004, radiation emissions are reduced when a human body is sensed in proximity to the sensors and/or the radiation emitter. When a human body is detected in proximity, a signal (e.g., a feedback signal) is sent to an emission control device of an electronic device. In response to the signal, the emission control device can limit RF EMF emissions (in other words limit RF output power). Therefore, RF EMF radiation exposure is limited for the detected human body in proximity to the electronic device. In other words, when a human body is discriminated as in proximity to the electronic device, the electromagnetic radiation power or the exposure time from a radiation source can be limited.

Method 1000 can provide significant advantages for manufacturers of electronic devices with RF EMF radiation sources to meet stringent criteria for emission regulations and specific absorption rate (SAR) standards by reducing radiation when a human body is in proximity to the electronic device.

The above description of illustrated embodiments, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

As used herein, the word "example" is used herein to mean serving as an example, instance, or illustration. For the avoidance of doubt, the subject matter described herein is not limited by such examples. In addition, any aspect or design described herein as an "example" is not necessarily to be construed as preferred or advantageous over other aspects or designs, nor is it meant to preclude equivalent structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

In this regard, while the described subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims.

What is claimed is:

1. A system, comprising:
a first sensor having a first shape, wherein the first sensor detects a first capacitance related to an object located at a specified non-zero distance from the first sensor;
a second sensor having a second shape different from the first shape, wherein the second sensor detects a second capacitance related to the object, wherein the first sensor and the second sensor are concentric, and the second sensor fully encircles the first sensor, and wherein a first size of the first sensor and a second size of the second sensor are adapted based on a third size of the object and a distance detection criterion;
an electronic component, operatively arranged for measuring the capacitances of the first sensor and the second sensor in a multiplexed manner, that performs a mathematical operation that employs the first capacitance and the second capacitance to generate an output, wherein the output facilitates discrimination of whether the object is a human body or a non-human object based on capacitance profiles associated with different dielectric properties of the human body and the non-human object; and
an active bias shield comprising an active bias driver that tracks respective voltages on the first sensor and the second sensor, wherein the active bias shield is configured to provide sensing directionality associated with detection of the object.

2. The system of claim 1, wherein
the first sensor has a first area and a first perimeter, and wherein
the second sensor has a second area and a second perimeter, and further wherein
the first area is different from the second area.

3. The system of claim 1, wherein
the first sensor has a first area and a first perimeter, and wherein
the second sensor has a second area and a second perimeter, and further wherein
the first perimeter is different from the second perimeter.

4. The system of claim 1, wherein the electronic component determines a sum of the first capacitance and the second capacitance to facilitate the discrimination.

5. The system of claim 1, wherein the electronic component determines a difference between the first capacitance and the second capacitance to facilitate the discrimination.

6. The system of claim 1, further comprising a radiation source that limits electromagnetic radiation power or exposure time from the radiation source in response to a determination, based on the first capacitance and the second capacitance, that the object is the human body.

7. The system of claim 1, wherein the first sensor and the second sensor are configured in a partially symmetrical arrangement or in a fully-symmetrical arrangement.

8. The system of claim 1, wherein the first sensor comprises a first conductive material and the second sensor comprises of a second conductive material.

9. The system of claim 1, wherein the electronic component comprises a time-multiplexed capacitance-to-digital converter.

10. The system of claim 1, further comprising a radiation source that modifies an emission of radiation in response to a determination, based on the first capacitance and the second capacitance, that the object is the human body.

11. A method, comprising:
processing a first signal indicative of a first capacitance from a first sensor having a first shape;
processing a second signal indicative of a second capacitance from a second sensor having a second shape that encircles the first shape, wherein the first capacitance and the second capacitance are acquired in a multiplexed fashion, and wherein a first size of the first sensor and a second size of the second sensor are selected based on a third size of an object that is to be detected and a distance detection criterion associated with a non-zero distance between the object and at least one of the first sensor or the second sensor;
determining a type of the object of a set of objects having different dielectric properties that is in proximity of the first sensor and the second sensor based on capacitance profile data associated with the different dielectric properties of the set of objects;
tracking, by an active bias driver, respective voltages on the first sensor and the second sensor; and
based on the respective voltages, configuring sensing directionality associated with detection of the object.

12. The method of claim 11, wherein
the first sensor has a first area and a first perimeter, and wherein
the second sensor has a second area and a second perimeter, and further wherein
the first area is different from the second area.

13. The method of claim 11, wherein
the first sensor has a first area and a first perimeter, and wherein
the second sensor has a second area and a second perimeter, and further wherein
the first perimeter is different from the second perimeter.

14. The method of claim 11, wherein the determining further comprises calculating a difference between the first capacitance and the second capacitance, and determining the type of object based on the difference.

15. The method of claim 11, wherein the determining comprises determining that the object is a human body and the method further comprises:
in response to the determining, instructing a controller device to reduce a radio-frequency (RF) electromagnetic field (EMF) emission.

16. An apparatus, comprising:
a first sensor that detects a first capacitance;
a second sensor that detects a second capacitance, the second sensor is concentric with and fully encircles the first sensor, wherein a first size of the first sensor and a second size of the second sensor are selected based on a third size of an object to be detected and a distance detection criterion associated with a non-zero distance between the object and at least one of the first sensor or the second sensor;
an electronic component configured to measure the first capacitance and the second capacitance in a multiplexed manner, and configured to generate an output based on a mathematical operation that employs the first capacitance and the second capacitance, wherein the output is employed to determine that the object in proximity of the apparatus is a human body based on a capacitance profile associated with a dielectric property of the human body; and
an active bias shield comprising an active bias driver configured to track respective voltages on the first sensor and the second sensor, wherein the respective voltages are employed to provide sensing directionality associated with detection of the object.

17. The apparatus of claim 16, further comprising a radiation emitter that reduces emitted radiation in response to the determination that the object in proximity to the apparatus is the human body.

18. The apparatus of claim 16, wherein the electronic component processes a first time-dependent profile of the first capacitance and a second time-dependent profile of the second capacitance to facilitate the determination of whether the object in proximity of the apparatus is the human body or a non-human object.

* * * * *